(12) United States Patent
Suzuki

(10) Patent No.: US 11,551,983 B2
(45) Date of Patent: Jan. 10, 2023

(54) SEMICONDUCTOR DEVICE HAVING CONTROL TERMINAL AND CONTROL SUBSTRATE

(71) Applicant: Mitsubishi Electric Corporation, Tokyo (JP)

(72) Inventor: Shin Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/179,137

(22) Filed: Feb. 18, 2021

(65) Prior Publication Data

US 2021/0366795 A1 Nov. 25, 2021

(30) Foreign Application Priority Data

May 20, 2020 (JP) ................. 2020-088190

(51) Int. Cl.
| | | |
|---|---|---|
| H01L 23/02 | (2006.01) | |
| H01L 23/043 | (2006.01) | |
| H01L 23/498 | (2006.01) | |
| H01L 25/07 | (2006.01) | |
| H01L 23/00 | (2006.01) | |
| H05K 1/18 | (2006.01) | |

(52) U.S. Cl.
CPC ...... *H01L 23/043* (2013.01); *H01L 23/49811* (2013.01); *H01L 24/48* (2013.01); *H01L 25/072* (2013.01); *H05K 1/18* (2013.01); *H01L 2224/48091* (2013.01)

(58) Field of Classification Search
CPC . H01L 23/043; H01L 23/49811; H01L 24/48; H01L 25/072; H01L 2224/48091; H01L 25/18; H01L 23/24; H01L 23/053; H01L 23/36; H01L 25/10; H01L 25/16; H01L 23/5385; H01L 23/04; H01L 23/49; H05K 1/18
USPC ........................................................ 257/678
See application file for complete search history.

(56) References Cited

U.S. PATENT DOCUMENTS 9,379,096 B2 * 6/2016 Denta ............... H01L 23/49575
2013/0250535 A1 9/2013 Takamiya et al.

FOREIGN PATENT DOCUMENTS

WO 2012/066833 A1 5/2012

* cited by examiner

*Primary Examiner* — Jami Valentine Miller
*Assistant Examiner* — Dilinh P Nguyen
(74) *Attorney, Agent, or Firm* — Studebaker & Brackett PC

(57) ABSTRACT

A semiconductor device includes: a case having an opening; a semiconductor element contained in the case; a control substrate which is disposed above the semiconductor element in the case and on which a control circuit to control the semiconductor element is disposed; a lid to cover the opening of the case; and a control terminal having one end portion connected to the control circuit disposed on the control substrate and the other end portion protruding out of the case. The control terminal has a bend in the case, and a side portion of the case or the lid is provided with a support capable of supporting the bend.

5 Claims, 5 Drawing Sheets

SEMICONDUCTOR DEVICE HAVING CONTROL TERMINAL AND CONTROL SUBSTRATE

BACKGROUND OF THE INVENTION

Field of the Invention

The present disclosure relates to semiconductor devices.

Description of the Background Art

A power semiconductor device typified by an insulated gate bipolar transistor (IGBT) module and an intelligent power module (IPM) typically includes main terminals to handle large currents and high voltages and control terminals to handle switching ON and OFF. The control terminals are connected to an external connector, and switching of the power semiconductor device is controlled by an external signal.

The external connector is often connected to be fit onto the control terminals. The control terminals are often formed linearly in a direction of fitting of the external connector or embedded in a case or a lid of the semiconductor device. This makes the control terminals less likely to be bent by stress applied when the external connector is fit onto the control terminals.

In particular, in the IPM, a control substrate for a control function and a protection function is provided in the module. The control terminals are typically formed linearly from the control substrate in a direction perpendicular to the surface of the substrate, and each have one end portion protruding out of the module.

However, the IPM, which contains a plurality of power semiconductor elements, prioritizes securement of phase-to-phase insulating distances, so that the locations of the control terminals connected to a control circuit on the control substrate are limited. The locations of protrusions of the control terminals out of the module are also limited. It is contemplated that the control terminals be bent to cause the control terminals to protrude from any given locations.

For example, WO 2012/066833 discloses a control terminal having a bend. The control terminal further has a protrusion at a side thereof. The protrusion is brought into contact with a protrusion receiver of a lid of a module to relieve stress transmitted to an insulating substrate through the control terminal when an external connector is fit onto the control terminal.

In technology disclosed in WO 2012/066833, however, there is concern that, in a case where stress beyond expectations is applied when the external connector is fit onto the control terminal, the protrusion of the control terminal cannot bear the stress to allow the control terminal to be pushed into the module. There is concern that, in a case where the control terminal is pushed into the module, the protrusion might be caught by the lid to prevent the control terminal from returning to an original location to thereby bend the control terminal.

SUMMARY

It is an object of the present disclosure to provide a semiconductor device including control terminals less likely to be bent when an external connector is fit onto the control terminals.

A semiconductor device of the present disclosure includes a case, a semiconductor element, a control substrate, a lid, and a control terminal. The case has an opening. The semiconductor element is contained in the case. The control substrate is disposed above the semiconductor element in the case. A control circuit to control the semiconductor element is disposed on the control substrate. The lid covers the opening of the case. The control terminal has one end portion connected to the control circuit disposed on the control substrate and the other end portion protruding out of the case. The control terminal has a bend in the case, and a side portion of the case or the lid is provided with a support capable of supporting the bend.

The support can support the control terminal in a case where the control terminal is pushed into the case by stress applied to the control terminal when the external connector is fit onto the control terminal. Bending of the control terminal can thereby be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
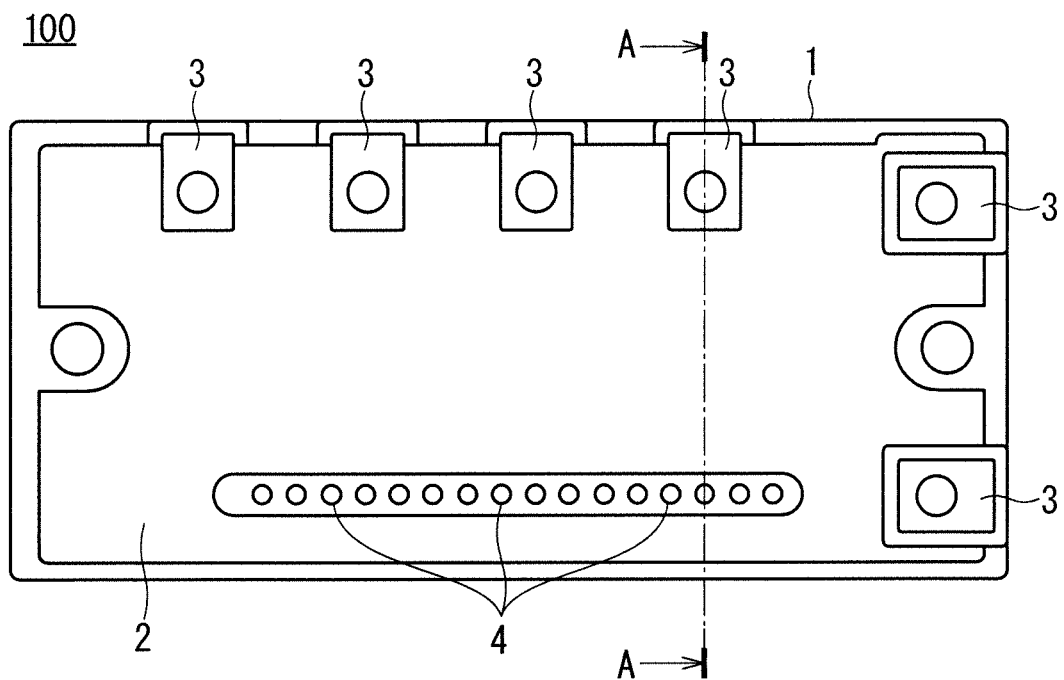
FIG. 1 is a plan view of a semiconductor device in Embodiment 1.
Figure 2:
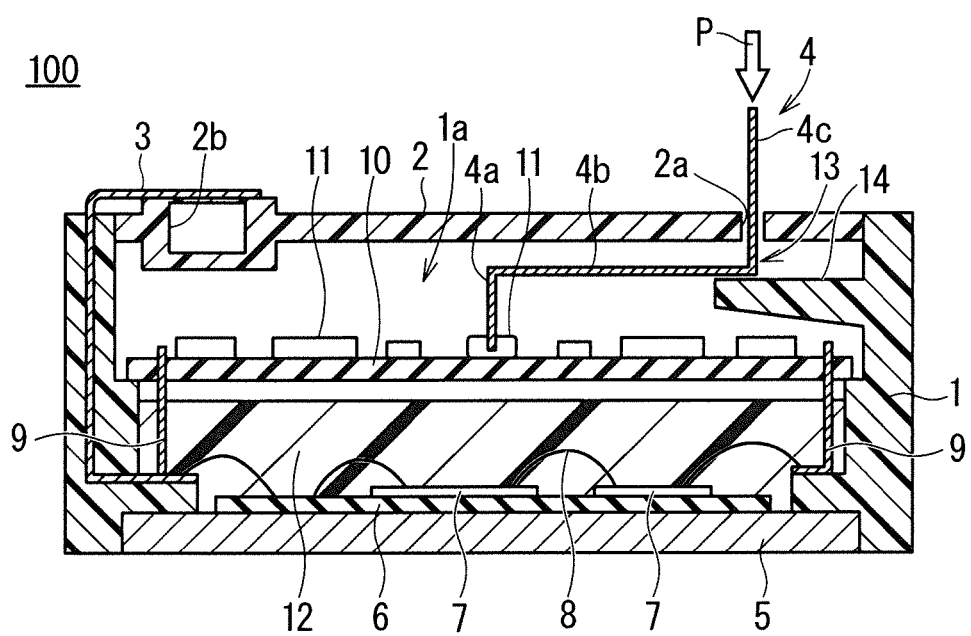
FIG. 2 is a cross-sectional view taken along the line A-A of FIG. 1.
Figure 3:
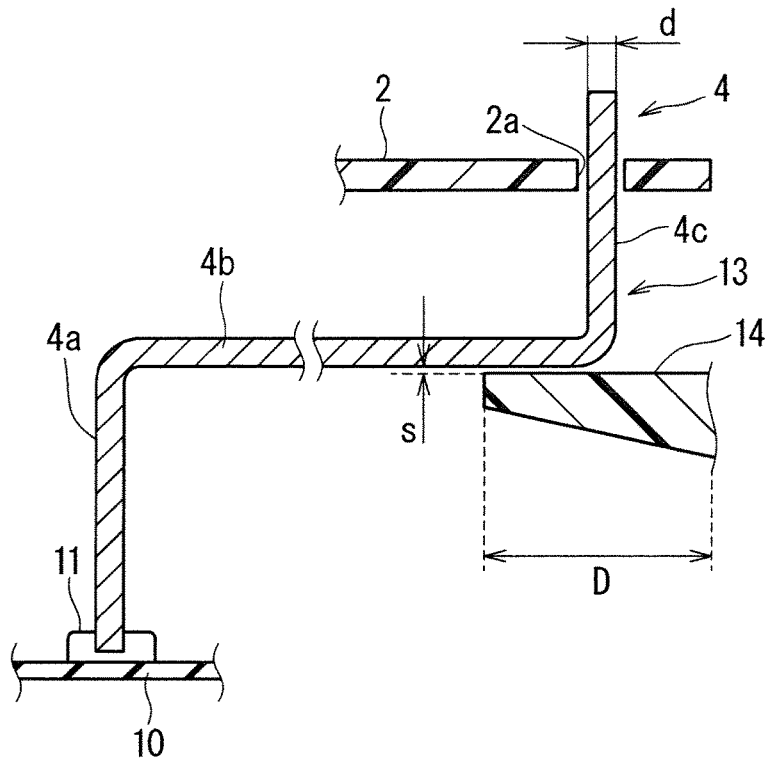
FIG. 3 is an enlarged cross-sectional view around a control terminal.

Embodiment 1 will be described below with reference the drawings. FIG. 1 is a plan view of a semiconductor device 100 in Embodiment 1. FIG. 2 is a cross-sectional view taken along the line A-A of FIG. 1. FIG. 3 is an enlarged cross-sectional view around a control terminal 4.

As illustrated in FIGS. 1 and 2, the semiconductor device 100 is, for example, an IPM, and includes a base plate 5, an insulating substrate 6, a plurality of semiconductor elements 7, a case 1, a sealing resin 12, a lid 2, a control substrate 10, a plurality of main terminals 3, a plurality of control terminals 4, and a plurality of relay terminals 9. The semiconductor device 100 may be a module other than the IPM.

The base plate 5 is made of metal, such as copper, and is rectangular in plan view. The insulating substrate 6 is provided in a portion excluding a periphery on a top surface of the base plate 5. The case 1 has a rectangular frame shape in plan view, and is joined to the periphery of the base plate 5. The case 1 is made of resin, and is insulating. An upper portion of a side portion of the case 1 is provided with a support 14 protruding inward. The support 14 will be described in detail below.

The plurality of semiconductor elements 7 are mounted on a top surface of the insulating substrate 6. Although not illustrated, the insulating substrate 6 includes an insulating layer made of ceramic and the like, a circuit layer joined to one main surface of the insulating layer and being made of metal, such as copper, having a surface to which the semiconductor elements 7 or wires 8 are joined, and a metal layer joined to the other main surface of the insulating layer and being made of metal, such as copper. The plurality of semiconductor elements 7 are connected to one another through the wires 8. The plurality of semiconductor elements 7 are also connected to the insulating substrate 6, the main terminals 3, and the relay terminals 9 through the wires 8.

Although not illustrated in detail in FIG. 2, collector electrodes and emitter electrodes of the semiconductor elements 7 are connected to the main terminals 3 through the wires 8, and, in particular, emitter sense electrodes are connected to the control substrate 10 through the relay terminals 9.

The plurality of relay terminals 9 are provided to stand on an inner side of a lower portion of the side portion of the case 1. The plurality of main terminals 3 have U-shaped cross sections, and are embedded in the case 1. Lower end portions of the plurality of main terminals 3 are exposed from an inner periphery of the case 1, and are connected to the insulating substrate 6 through the wires 8. Upper end portions of the plurality of main terminals 3 are bent at an upper end of the case 1 toward an opposite side of the case 1, and are attached to a plurality of threaded holes 2b of the lid 2.

The control substrate 10 is disposed above the semiconductor elements 7 in the case 1. A plurality of control circuits 11 to control the plurality of semiconductor elements 7 are arranged on a top surface of the control substrate 10. The control substrate 10 has a plurality of through holes (not illustrated) into which upper end portions of the relay terminals 9 are inserted.

The sealing resin 12 is, for example, an epoxy resin, and is loaded between the base plate 5 and the control substrate 10 in the case 1.

The lid 2 is attached above the control substrate 10 in the case 1 to cover an opening 1a of the case 1. The lid 2 has the plurality of threaded holes 2b and a single hole 2a as a through hole.

The control terminals 4 will be described next. As illustrated in FIGS. 2 and 3, the control terminals 4 are terminals to which an external connector 111 (see FIG. 4) is connected. An ON signal to switch the semiconductor elements 7 to an ON state and an OFF signal to switch the semiconductor elements 7 to an OFF state are input into the control terminals 4 through the external connector 111.

Each of the control terminals 4 includes a vertical portion 4a as a first portion, a horizontally extending portion 4b as a second portion, and a withdrawn portion 4c as a third portion. The vertical portion 4a extends upward (vertically) from a control circuit 11. The horizontally extending portion 4b extends laterally (horizontally) from an end portion of the vertical portion 4a opposite the control circuit 11. The withdrawn portion 4c extends upward (vertically) from an end portion of the horizontally extending portion 4b opposite the vertical portion 4a, and protrudes from the hole 2a of the lid 2.

The control terminal 4 has a bend 13 in the case 1. The bend 13 has been bent between the horizontally extending portion 4b and the withdrawn portion 4c.

The support 14 provided to the side portion of the case 1 will be described next. As illustrated in FIGS. 2 and 3, the support 14 protrudes inward from the side portion of the case 1 to support the bend 13 of the control terminal 4 from below. In particular, a portion of the bend 13 corresponding to the horizontally extending portion 4b is supported, so that bending of the horizontally extending portion 4b of the control terminal 4 is suppressed. The support 14 tapers to a distal end thereof. Specifically, a top surface of the support 14 is a level surface, and a bottom surface of the support 14 is inclined so that the distal end is located above a proximal end.

As illustrated in FIG. 3, the support 14 has a length D to allow a diameter d of the withdrawn portion 4c as a whole to be located above the support 14. A gap s is formed between the horizontally extending portion 4b and the support 14. The gap s is formed so that there is an allowance for pushing of the height of the gap s when the control terminal 4 is externally pushed in a direction of an arrow P of FIG. 2, and stress is applied to the control terminal 4. The height of the gap s is set so that a lower end of the horizontally extending portion 4b and the top surface of the support 14 form an angle of approximately 5° or more and 10° or less when stress is applied in the direction of the arrow P.

Figure 4:
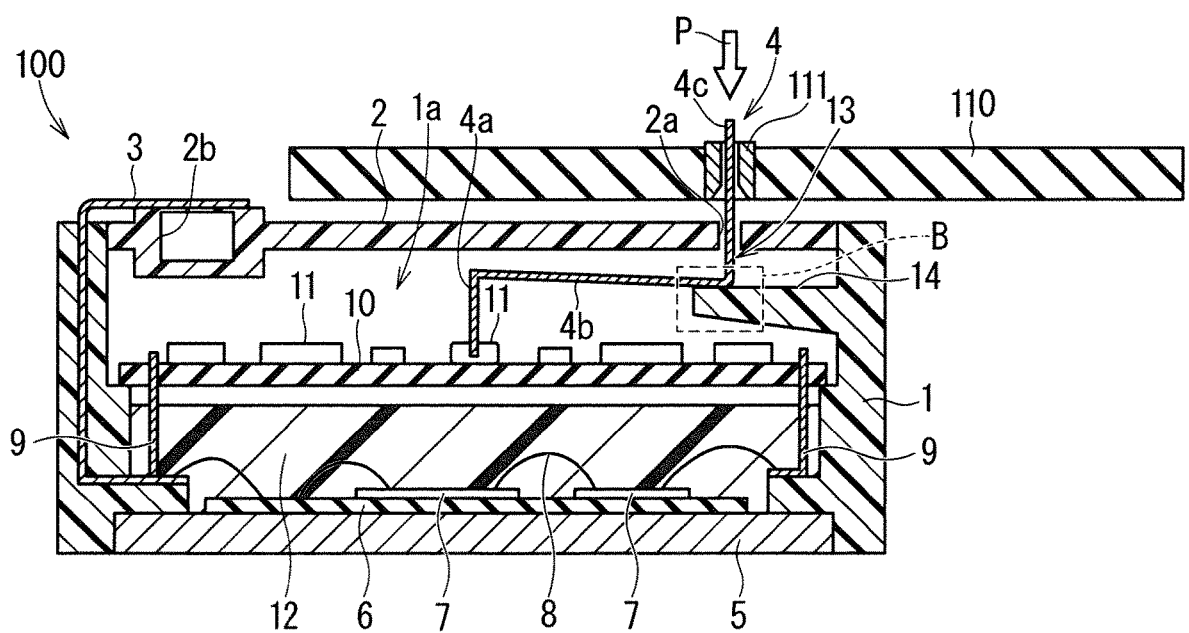
FIG. 4 is a cross-sectional view of the semiconductor device in Embodiment 1 to illustrate stress applied when an external connector of an external substrate is fit onto the control terminal.
Figure 5:
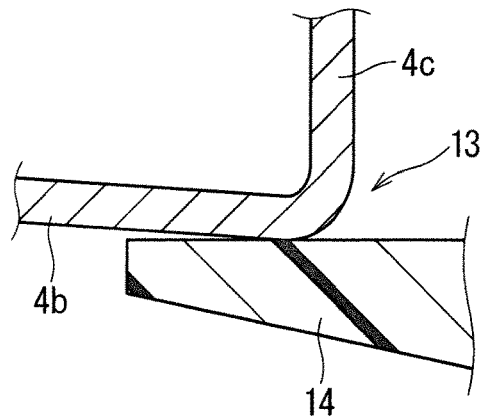
FIG. 5 is an enlarged view of a region B of FIG. 4.

Operations and effects of the semiconductor device 100 in Embodiment 1 will be described next with reference to FIGS. 4 and 5. FIG. 4 is a cross-sectional view of the semiconductor device 100 in Embodiment 1 to illustrate stress applied when the external connector 111 of an external substrate 110 is fit onto the control terminal 4. FIG. 5 is an enlarged view of a region B of FIG. 4.

As illustrated in FIG. 4, stress is applied in the direction of the arrow P when the external connector 111 is fit onto the control terminal 4. If the support 14 is not provided, the control terminal 4 is pushed downward by the stress, and the horizontally extending portion 4b of the control terminal 4 is bent.

As illustrated in FIGS. 4 and 5, the semiconductor device 100 in Embodiment 1 includes the case 1 having the opening 1a, the semiconductor elements 7 contained in the case 1, the control substrate 10 which is disposed above the semiconductor elements 7 in the case 1 and on which the control circuits 11 to control the semiconductor elements 7 are arranged, the lid 2 to cover the opening 1a of the case 1, and the control terminals 4 each having the one end portion connected to one of the control circuits 11 arranged on the control substrate 10 and the other end portion protruding out of the case 1. Each of the control terminals 4 has the bend 13 in the case 1, and the side portion of the case 1 is provided with the support 14 capable of supporting the bend 13.

The support 14 can thus support the control terminal 4 in a case where the control terminal 4 is pushed into the case 1 by stress applied to the control terminal 4 when the external connector 111 is fit onto the control terminal 4. Bending of the control terminal 4 can thereby be suppressed. This enables long-term use of the semiconductor device 100.

The control terminal 4 includes the vertical portion 4a extending upward from the control circuit 11, the horizontally extending portion 4b extending laterally from the end portion of the vertical portion 4a opposite the control circuit 11, and the withdrawn portion 4c extending upward from the end portion of the horizontally extending portion 4b opposite the vertical portion 4a, and protruding from the hole 2a of the lid 2. The bend 13 has been bent between the horizontally extending portion 4b and the withdrawn portion 4c. The support 14 is provided to protrude inward from the side portion of the case 1, and can support the bend 13 from below.

The portion of the bend 13 corresponding to the horizontally extending portion 4b is thus supported, so that bending of the horizontally extending portion 4b of the control terminal 4 can be suppressed.

The support 14 supports the bend 13 from below, so that fitting of the external connector 111 onto the control terminal 4 is facilitated.

In particular, as illustrated in FIG. 3, the gap s is formed between the horizontally extending portion 4b and the support 14. Thus, when excessive stress is applied to the control terminal 4 by fitting of the external connector 111, stress applied to the horizontally extending portion 4b can be relieved, and excessive pushing of the control terminal 4 by the external connector 111 can be suppressed.

Embodiment 2

Figure 6:
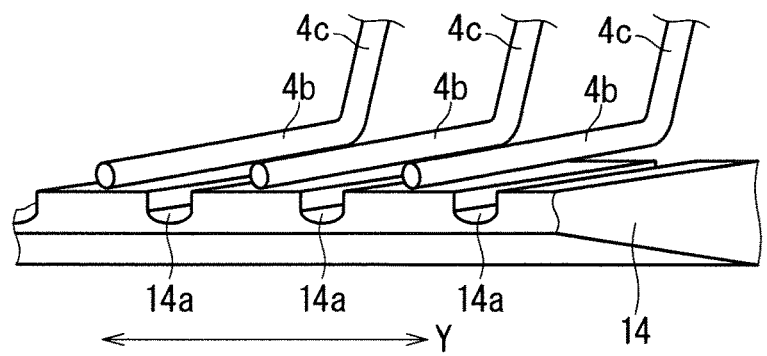
FIG. 6 is a perspective view of control terminals and a support in Embodiment 2.
Figure 7:
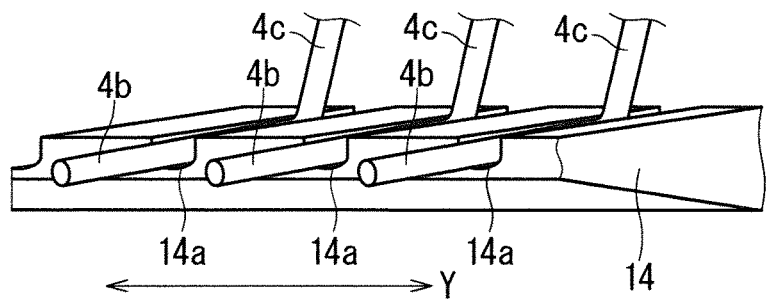
FIG. 7 is a perspective view illustrating a state of the control terminals being accommodated in grooves in Embodiment 2.
Figure 8:
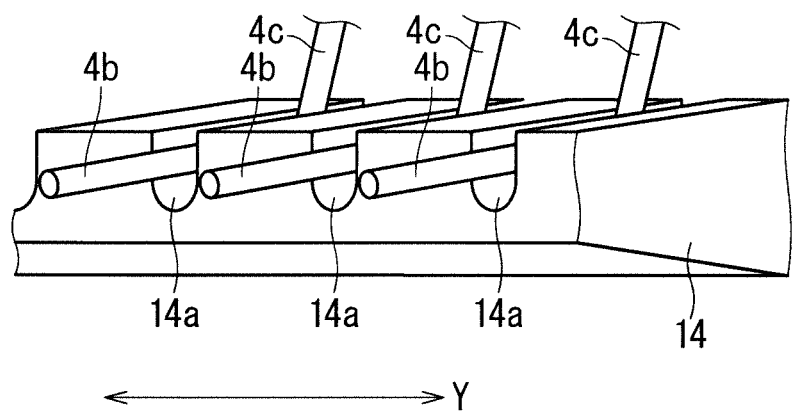
FIG. 8 is a perspective view illustrating a state of the control terminals being accommodated in the grooves in a modification of Embodiment 2.

The semiconductor device 100 in Embodiment 2 will be described next. FIG. 6 is a perspective view of the control terminals 4 and the support 14 in Embodiment 2. FIG. 7 is a perspective view illustrating a state of the control terminals 4 being accommodated in grooves 14a in Embodiment 2. FIG. 8 is a perspective view illustrating a state of the control terminals 4 being accommodated in the grooves 14a in a modification of Embodiment 2. A bidirectional arrow Y in each of FIGS. 6 to 8 indicates a direction of a Y axis. In Embodiment 2, the same components as those described in Embodiment 1 bear the same reference signs as those in Embodiment 1, and description thereof is omitted.

As illustrated in FIGS. 6 and 7, portions of the support 14 opposing the bends 13 of the control terminals 4 have the grooves 14a capable of accommodating the bends 13 in Embodiment 2. More specifically, the grooves 14a are formed to be arranged along the direction of the Y axis, and portions of the support 14 opposing portions of the horizontally extending portions 4b closer to the withdrawn portions 4c have the grooves 14a. Each of the grooves 14a has a width greater than the diameter of each of the horizontally extending portions 4b and a depth greater than the diameter of the horizontally extending portion 4b. The groove 14a can thus accommodate a portion of the horizontally extending portion 4b closer to the withdrawn portion 4c including the bend 13 of the control terminal 4.

As described above, in the semiconductor device 100 in Embodiment 2, the portions of the support 14 opposing the bends 13 of the control terminals 4 have the grooves 14a capable of accommodating the bends 13. The bends 13 of the control terminals 4 are thus accommodated in a case where the control terminals 4 are pushed into the case 1 by stress applied to the control terminals 4 when the external connector 111 is fit onto the control terminals 4, so that a side slip of the control terminals 4 in the direction of the Y axis can be suppressed. Contact between adjacent control terminals 4 can thereby be suppressed.

As illustrated in FIG. 8, the support 14 may have a greater thickness than that in a case of FIGS. 6 and 7, and the grooves 14a may each have a greater depth than those in the case of FIGS. 6 and 7. Stability of fitting of the external connector 111 can thereby be improved.

Embodiment 3

Figure 9:
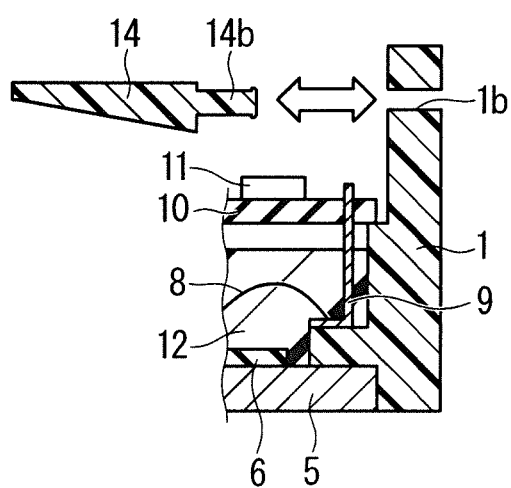
FIG. 9 is a cross-sectional view illustrating a state of a support being detached from a side portion of a case in Embodiment 3.

The semiconductor device 100 in Embodiment 3 will be described next. FIG. 9 is a cross-sectional view illustrating a state of the support 14 being detached from the side portion of the case 1 in Embodiment 3. In Embodiment 3, the same components as those described in Embodiments 1 and 2 bear the same reference signs as those in Embodiments 1 and 2, and description thereof is omitted.

As illustrated in FIG. 9, the support 14 is detachable from and attachable to the side portion of the case 1 in Embodiment 3.

The upper portion of the side portion of the case 1 has a mating hole 1b to which a proximal end 14b of the support 14 is mated. The mating hole 1b is a through hole, and the proximal end 14b of the support 14 is mated in a state of being inserted into the mating hole 1b. The support 14 is thus prevented from falling out. The mating hole 1b is slightly larger than the proximal end 14b, so that the support 14 is detachable from and attachable to the mating hole 1b.

As described above, in the semiconductor device 100 in Embodiment 3, the side portion of the case 1 has the mating hole 1b to which the proximal end 14b of the support 14 is mated, and the support 14 is detachable from and attachable to the mating hole 1b.

The support 14 thus does not interfere with processes, such as a wire bonding process, a resin sealing process, and a control substrate attaching process, at assembly of the semiconductor device 100. Improvement in yield of the semiconductor device 100 is thus expected.

The support 14 in Embodiment 3 can have the grooves described in Embodiment 2. In this case, an effect similar to the effect obtained in Embodiment 2 can be obtained.

Embodiment 4

Figure 10:
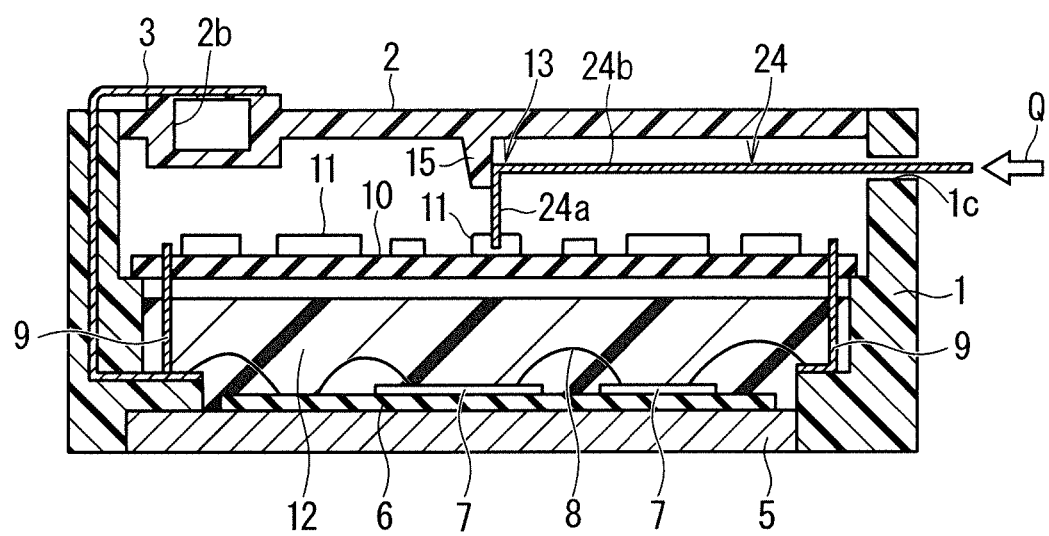
FIG. 10 is a cross-sectional view of a semiconductor device in Embodiment 4.

A semiconductor device 100A in Embodiment 4 will be described next. FIG. 10 is a cross-sectional view of the semiconductor device 100A in Embodiment 4. In Embodiment 4, the same components as those described in Embodiments 1 to 3 bear the same reference signs as those in Embodiments 1 to 3, and description thereof is omitted.

As illustrated in FIG. 10, the semiconductor device 100A is, for example, the IPM, and includes, in place of the support 14, a support 15 provided to the lid 2 in Embodiment 4. The semiconductor device 100A further includes control terminals 24 in place of the control terminals 4. The semiconductor device 100A may be a module other than the IPM.

Each of the control terminals 24 includes a vertical portion 24a as the first portion and a horizontally extending portion 24b as the second portion. The vertical portion 24a extends upward (vertically) from the control circuit 11. The horizontally extending portion 24b extends laterally (horizontally) from an end portion of the vertical portion 24a opposite the control circuit 11, and protrudes from a hole 1c as a through hole of the side portion of the case 1.

The control terminal 24 also has the bend 13 in the case 1. The bend 13 has been bent between the vertical portion 24a and the horizontally extending portion 24b.

The support 15 protrudes downward from a bottom surface of the lid 2 to support the bend 13 from a side opposite the hole 1c of the side portion with respect to the vertical portion 24a. In particular, a portion of the bend 13 corresponding to the vertical portion 24a is supported, so that bending of the vertical portion 24a is suppressed. The support 15 tapers to a distal end thereof. Specifically, a surface of the support 15 opposing the vertical portion 24a is a level surface, and an opposite surface of the support 15 is inclined so that the distal end is located closer to the vertical portion 24a than a proximal end is.

The relationship between the length of the support 15 and the diameter of the horizontally extending portion 24b is the same as the relationship between the length of the support 14 and the diameter of the withdrawn portion 4c described in Embodiment 1. The gap s is formed between the vertical portion 24a and the support 15 as in Embodiment 1.

As described above, the semiconductor device 100A in Embodiment 4 includes the case 1 having the opening 1a, the semiconductor elements 7 contained in the case 1, the control substrate 10 which is disposed above the semiconductor elements 7 in the case 1 and on which the control circuits 11 to control the semiconductor elements 7 are arranged, the lid 2 to cover the opening 1a of the case 1, and the control terminals 24 each having the one end portion connected to one of the control circuits 11 arranged on the control substrate 10 and the other end portion protruding out of the case 1. Each of the control terminals 24 has the bend 13 in the case 1, and the lid 2 is provided with the support 15 capable of supporting the bend 13.

The support 15 can thus support the control terminal 24 in a case where the control terminal 24 is pushed into the case 1 by stress applied to the control terminal 24 when the external connector is fit onto the control terminal 24. Bending of the control terminal 24 can thereby be suppressed.

The control terminal 24 includes the vertical portion 24a extending upward from the control circuit 11 and the horizontally extending portion 24b extending laterally from the end portion of the vertical portion 24a opposite the control circuit 11, and protruding from the hole 1c of the side portion of the case 1. The bend 13 has been bent between the vertical portion 24a and the horizontally extending portion 24b. The support 15 is provided to protrude downward from the bottom surface of the lid 2, and can support the bend 13 from the side opposite the hole 1c of the side portion with respect to the vertical portion 24a.

Stress applied in a direction of an arrow Q of FIG. 10 can thus be relieved, so that the control terminal 24 can be caused to protrude from a side of the semiconductor device 100A without limiting the location of protrusion of the control terminal 24 to the location above the semiconductor device 100A. A degree of freedom of the location of protrusion of the control terminal 24 is thereby improved.

The support 15 can have the grooves described in Embodiment 2. In this case, a side slip in a direction of arrangement of the control terminals 24 can be suppressed as in Embodiment 2. Contact between adjacent control terminals 24 can thereby be suppressed. In a case where the grooves have a greater depth than those in the case of FIGS. 6 and 7, stability of fitting of the external connector can be improved.

Embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a case having an opening;
   a semiconductor element contained in the case;
   a control substrate disposed directly above the semiconductor element in the case in a direction perpendicular to a surface of the case above which the semiconductor element is disposed, a control circuit to control the semiconductor element being disposed on the control substrate;
   a lid to cover the opening of the case; and
   a control terminal having one end portion connected to the control circuit disposed on the control substrate and the other end portion protruding out of the case, wherein
   the control terminal has a bend in the case, and
   a side portion of the case or the lid is provided with a support capable of supporting the bend.

2. The semiconductor device according to claim 1, wherein
   the control terminal includes a first portion, a second portion, and a third portion, the first portion extending upward from the control circuit, the second portion extending laterally from an end portion of the first portion opposite the control circuit, the third portion extending upward from an end portion of the second portion opposite the first portion and protruding from a hole of the lid,
   the bend has been bent between the second portion and the third portion, and
   the support is provided to protrude inward from the side portion of the case, and is capable of supporting the bend from below.

3. A semiconductor device comprising:
   a case having an opening;
   a semiconductor element contained in the case;
   a control substrate disposed above the semiconductor element in the case, a control circuit to control the semiconductor element being disposed on the control substrate;
   a lid to cover the opening of the case; and
   a control terminal having one end portion connected to the control circuit disposed on the control substrate and the other end portion protruding out of the case, wherein
   the control terminal has a bend in the case,
   a side portion of the case or the lid is provided with a support capable of supporting the bend,
   the control terminal includes a first portion, a second portion, and a third portion, the first portion extending upward from the control circuit, the second portion extending laterally from an end portion of the first portion opposite the control circuit, the third portion extending upward from an end portion of the second portion opposite the first portion and protruding from a hole of the lid,
   the bend has been bent between the second portion and the third portion,
   the support is provided to protrude inward from the side portion of the case, and is capable of supporting the bend from below,
   the side portion of the case has a mating hole to which a proximal end portion of the support is mated, and
   the support is detachable from and attachable to the mating hole.

4. A semiconductor device comprising:
   a case having an opening;
   a semiconductor element contained in the case;
   a control substrate disposed above the semiconductor element in the case, a control circuit to control the semiconductor element being disposed on the control substrate;
   a lid to cover the opening of the case; and a control terminal having one end portion connected to the control circuit disposed on the control substrate and the other end portion protruding out of the case, wherein the control terminal has a bend in the case, a side portion of the case or the lid is provided with a support capable of supporting the bend, the control terminal includes a first portion and a second portion, the first portion extending upward from the control circuit, the second portion extending laterally from an end portion of the first portion opposite the control circuit and protruding from a hole of the side portion of the case, the bend has been bent between the first portion and the second portion, and the support is provided to protrude downward from a bottom surface of the lid, and is capable of supporting the bend from a side opposite the hole of the side portion with respect to the first portion.

5. A semiconductor device comprising:

a case having an opening;

a semiconductor element contained in the case;

a control substrate disposed above the semiconductor element in the case, a control circuit to control the semiconductor element being disposed on the control substrate;

a lid to cover the opening of the case; and a control terminal having one end portion connected to the control circuit disposed on the control substrate and the other end portion protruding out of the case, wherein the control terminal has a bend in the case, a side portion of the case or the lid is provided with a support capable of supporting the bend, the control terminal includes a first portion, a second portion, and a third portion, the first portion extending upward from the control circuit, the second portion extending laterally from an end portion of the first portion opposite the control circuit, the third portion extending upward from an end portion of the second portion opposite the first portion and protruding from a hole of the lid, the bend has been bent between the second portion and the third portion, the support is provided to protrude inward from the side portion of the case, and is capable of supporting the bend from below, and a portion of the support opposing the bend of the control terminal has a groove capable of accommodating the bend.

* * * * *